(12) United States Patent
Sato et al.

(10) Patent No.: US 10,863,642 B2
(45) Date of Patent: Dec. 8, 2020

(54) HINGE AND HOUSING FOR ELECTRONIC DEVICE

(71) Applicant: FUJITSU CLIENT COMPUTING LIMITED, Kanagawa (JP)

(72) Inventors: Ryohei Sato, Kawasaki (JP); Ikki Tatsukami, Kawasaki (JP); Frank Müller Augste, Munich (DE); Albert Jiang, Munich (DE); Morris Sung, Munich (DE)

(73) Assignee: FUJITSU CLIENT COMPUTING LIMITED, Kanagawa (JP)

( * ) Notice: Subject to any disclaimer, the term of this patent is extended or adjusted under 35 U.S.C. 154(b) by 0 days.

(21) Appl. No.: 16/791,038

(22) Filed: Feb. 14, 2020

(65) Prior Publication Data

US 2020/0315046 A1    Oct. 1, 2020

(30) Foreign Application Priority Data

Mar. 26, 2019    (JP) .................................. 2019-058785

(51) Int. Cl.
*H05K 5/02*    (2006.01)
*H05K 5/03*    (2006.01)
(Continued)

(52) U.S. Cl.
CPC ............. *H05K 5/0226* (2013.01); *E05D 3/18* (2013.01); *G12B 9/04* (2013.01); *H05K 5/03* (2013.01)

(58) Field of Classification Search
CPC combination set(s) only.
See application file for complete search history.

(56) References Cited

U.S. PATENT DOCUMENTS 4,096,604 A  *  6/1978  Eckhardt .................... E05D 3/18
                                                              16/288
4,736,491 A  *  4/1988  Mertes ....................... E05D 3/18
                                                              16/358
(Continued)

FOREIGN PATENT DOCUMENTS

DE            10239599 A1  *  4/2003  ............... E05D 3/18
DE        102007033834 A1     1/2009
(Continued)

OTHER PUBLICATIONS

Notification of Reasons for Refusal issued in Japanese Patent Application No. 2019-058785, dated May 21, 2019 (11 pages).
(Continued)

*Primary Examiner* — Lisa Lea-Edmonds
(74) *Attorney, Agent, or Firm* — Osha Bergman Watanabe & Burton LLP

(57) ABSTRACT

A hinge includes a first part disposed in a first member and a second part disposed on a second member. The first part includes a first curved part with an arc shape protruding to outside in a radial direction of a rotational center, and a second curved part disposed outside the first curved part in the radial direction of the rotational center with spacing from the first curved part with an arc shape along the first curved part. The second part includes a connection disposed between the first curved part and the second curved part, wherein the connection moves smoothly along the first curved part and the second curved part about the rotational center. The second part couples, with the first part, the first member and the second member together to allow the first member and the second member to relatively rotate about the rotational center.

8 Claims, 18 Drawing Sheets

(51) Int. Cl.
*E05D 3/18* (2006.01)
*G12B 9/04* (2006.01)

(56) References Cited

U.S. PATENT DOCUMENTS

| | | | | |
|---|---|---|---|---|
| 4,827,569 | A * | 5/1989 | Mertes | E05D 3/16 16/288 |
| 5,195,796 | A * | 3/1993 | Wampler, II | E05D 3/18 16/358 |
| 6,711,001 | B2 * | 3/2004 | Hernandez | G06F 1/181 248/568 |
| 7,876,551 | B2 * | 1/2011 | Wang | G06F 1/181 361/679.02 |
| 8,303,059 | B2 * | 11/2012 | Darney | E05D 3/18 312/405 |
| 9,376,845 | B2 * | 6/2016 | Sawaguchi | E06B 3/34 |
| 9,518,414 | B1 * | 12/2016 | Chen | H05K 5/0226 |
| 9,801,290 | B2 * | 10/2017 | Ahn | G06F 1/1652 |
| 2009/0071075 | A1 * | 3/2009 | Hoffmann | E05D 3/18 49/260 |
| 2010/0103601 | A1 | 4/2010 | Wang et al. | |
| 2011/0304983 | A1 * | 12/2011 | Senatori | G06F 1/1681 361/679.55 |
| 2012/0025686 | A1 * | 2/2012 | Darney | E05D 3/18 312/405 |
| 2014/0138336 | A1 * | 5/2014 | Watanabe | H05K 7/18 211/183 |
| 2018/0222230 | A1 * | 8/2018 | Mergen | B41J 29/13 |
| 2018/0313399 | A1 * | 11/2018 | Nakamura | H04M 1/0268 |

FOREIGN PATENT DOCUMENTS

| | | |
|---|---|---|
| DE | 202009003379 U1 | 7/2010 |
| JP | 2004318302 A | 11/2004 |
| JP | 2008191960 A | 8/2008 |
| JP | 2012137884 A | 7/2012 |
| JP | 2015518190 A | 6/2015 |

OTHER PUBLICATIONS

Notification of Reasons for Refusal issued in Japanese Patent Application No. 2019-058785, dated Oct. 15, 2019 (9 pages).
Office Action issued in corresponding German Application No. 10 2020 202 007.8 dated Mar. 27, 2020 (8 pages).

* cited by examiner

FIG.3
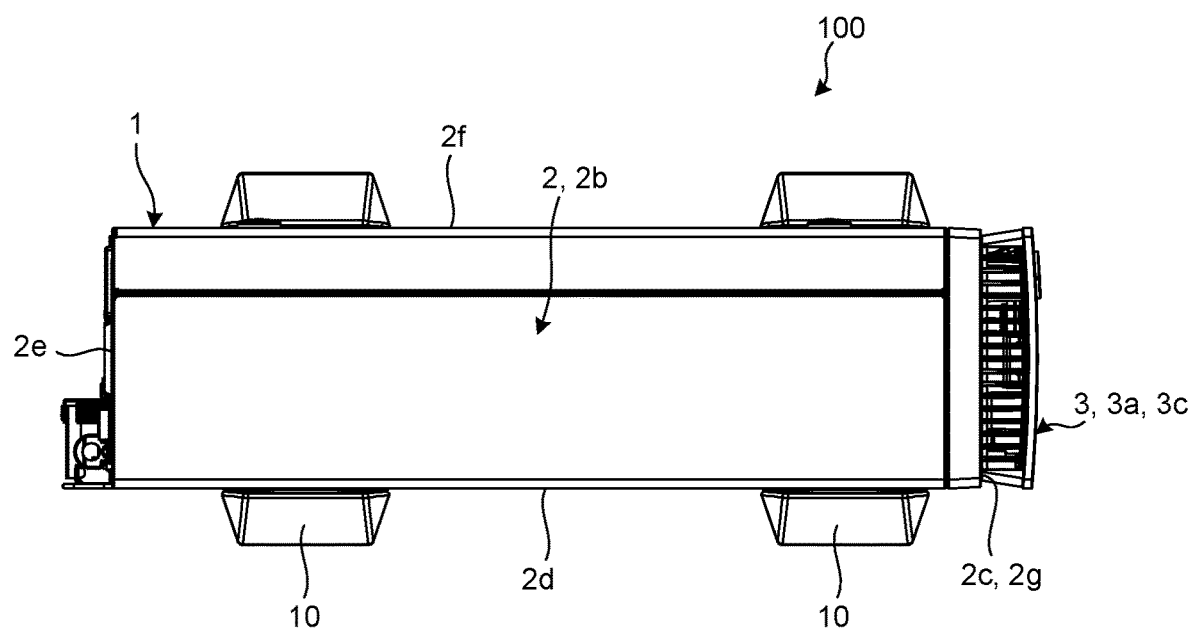
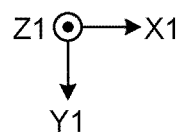

FIG.7
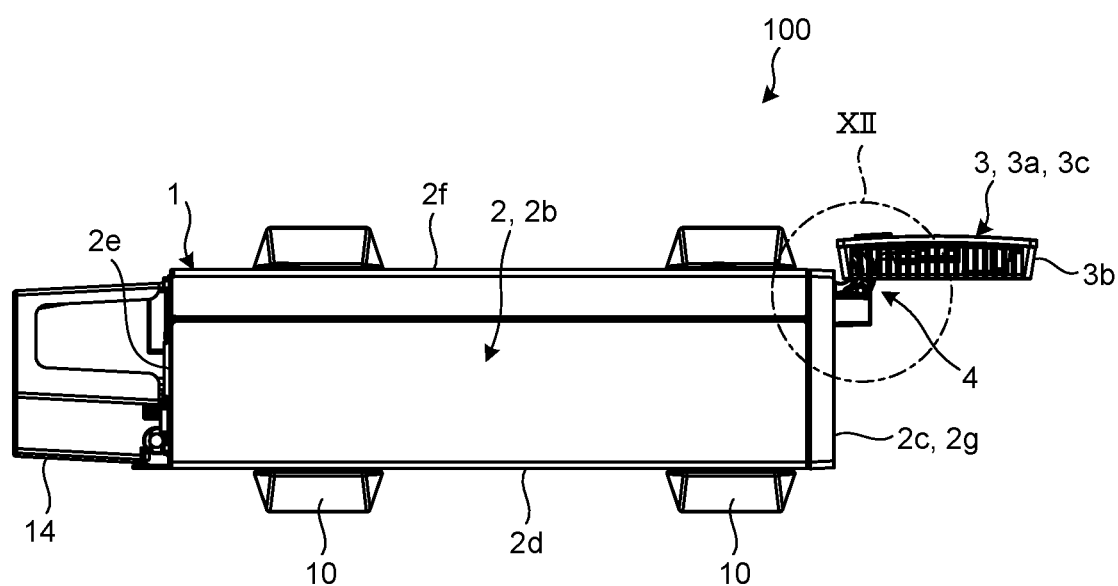
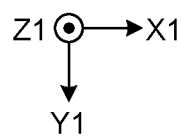

HINGE AND HOUSING FOR ELECTRONIC DEVICE

CROSS-REFERENCE TO RELATED APPLICATIONS

This application is based upon and claims the benefit of priority from Japanese Patent Application No. 2019-058785, filed Mar. 26, 2019, the entire contents of which are incorporated herein by reference.

FIELD

Embodiments described herein relate generally to a hinge and a housing for an electronic device.

BACKGROUND

Conventionally, electronic devices with a housing including a first member and a second member rotatably coupled together about a rotational center with a hinge are known, for example.

In such a housing of an electronic device, for example, the external forms of the first member and the second member around the rotational center may be restricted by the hinge.

It is thus preferable to provide a hinge that imposes less restrictions on the external forms of a first member and a second member to be coupled together around a rotational center, and a housing for an electronic device including the hinge.

SUMMARY

According to one aspect of this disclosure, a hinge includes a first part located (disposed) in a first member and a second part located on a second member. The first part includes a first curved part having an arc shape protruding to outside in a radial direction of a rotational center, and a second curved part located outside the first curved part in the radial direction of the rotational center with spacing from the first curved part, and having an arc shape along the first curved part. The second part includes a connection located between the first curved part and the second curved part, and slidable relative to the first curved part and the second curved part about the rotational center. The second part couples, with the first part, the first member and the second member together to allow the first member and the second member to relatively rotate about the rotational center

BRIEF DESCRIPTION OF THE DRAWINGS

FIG. 3 is an illustrative plan view of the electronic device according to the first embodiment;

FIG. 7 is an illustrative plan view of the electronic device according to the first embodiment, with the door placed in the open position;

DETAILED DESCRIPTION

Figure 1:
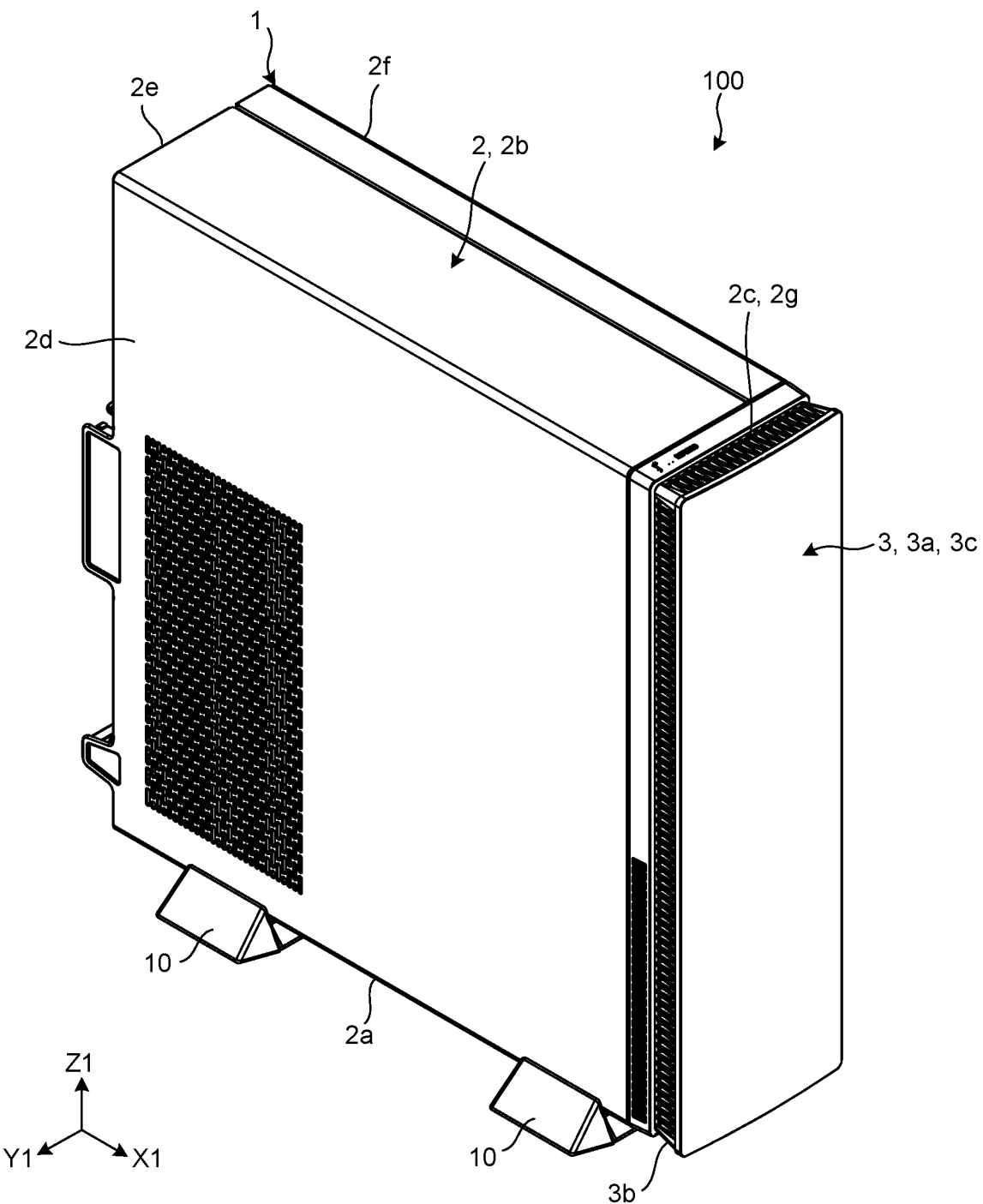
FIG. 1 is an illustrative perspective view of an electronic device according to a first embodiment.

The following describes exemplary embodiments. The features of the embodiment described below and functions and effects attained by the features are presented for illustrative purposes only. The embodiment can be implemented by features other than the ones disclosed herein. The embodiment can attain at least one of the effects including derivative effects attained by the features.

The following embodiments include like or same elements. Like or same elements are denoted by the same reference numerals, and overlapping descriptions thereof are thus omitted. Throughout this disclosure, ordinal numbers are used to distinguish parts, components, members, portions, positions, directions, and else, and are not intended to indicate order or priority.

First Embodiment

Figure 2:
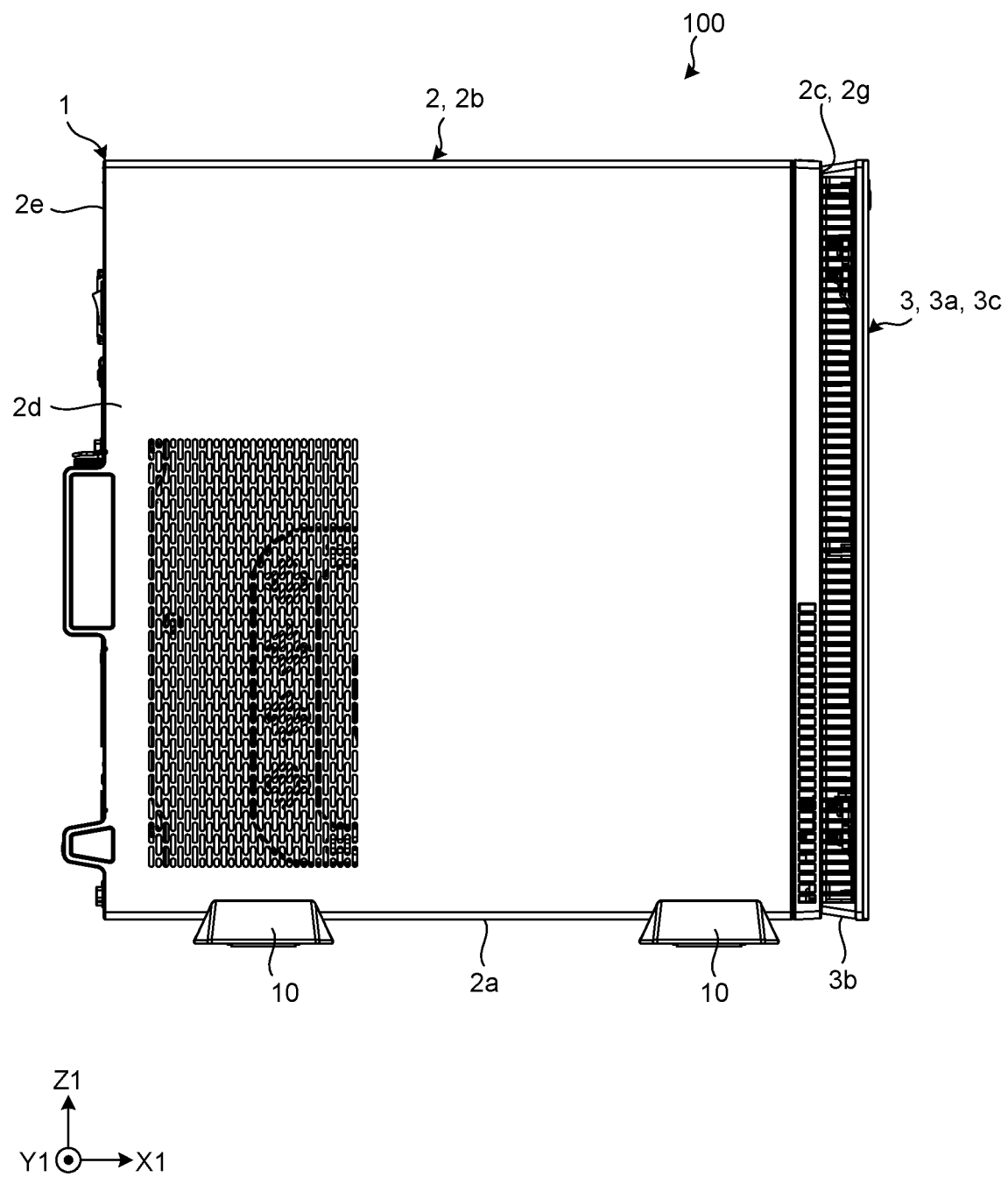
FIG. 2 is an illustrative side elevational view of the electronic device according to the first embodiment.
Figure 4:
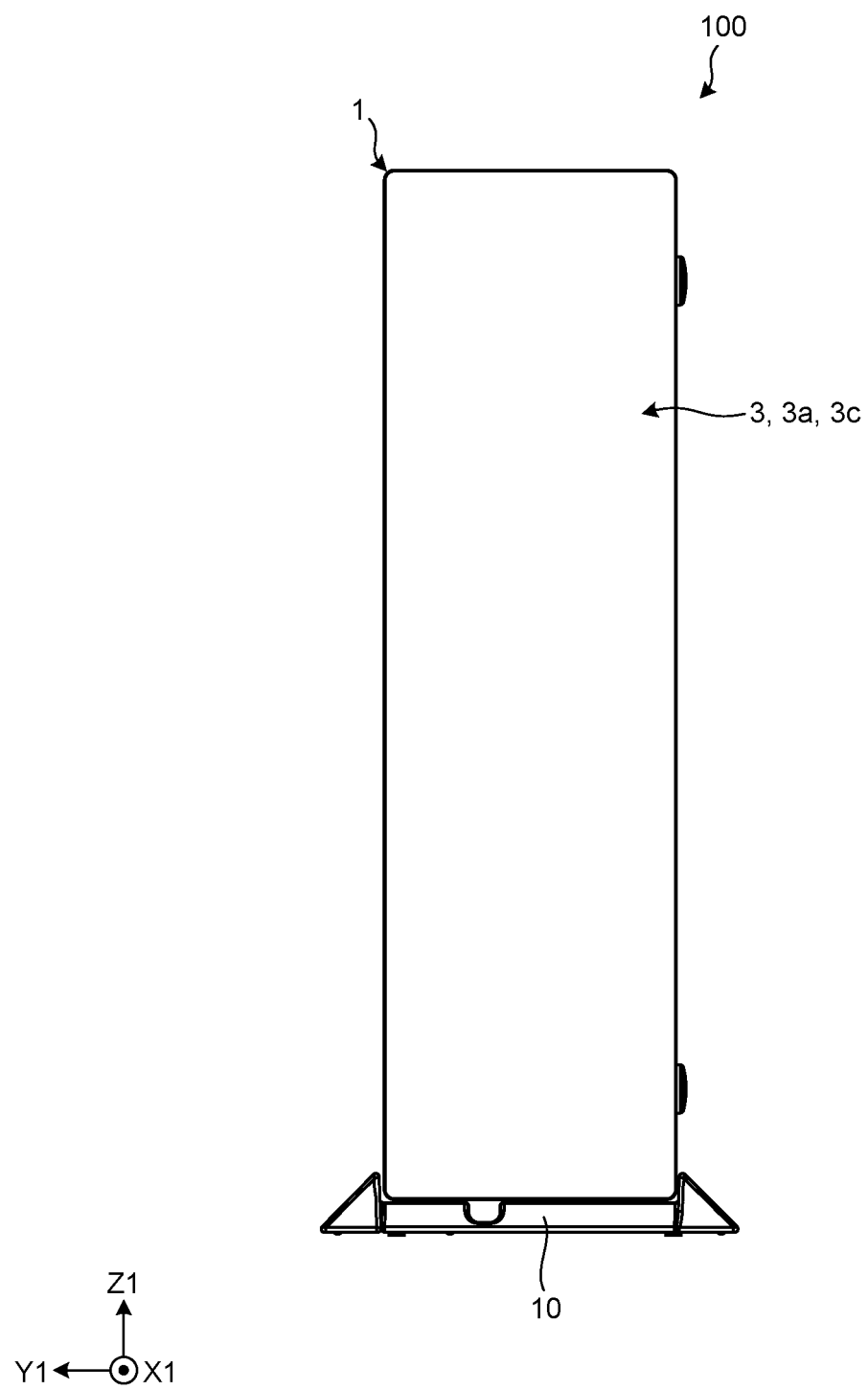
FIG. 4 is an illustrative front elevational view of the electronic device according to the first embodiment.

FIG. 1 is an illustrative perspective view of an electronic device 100 according to a first embodiment. FIG. 2 is an illustrative side elevational view of the electronic device 100 according to the first embodiment. FIG. 3 is an illustrative plan view of the electronic device 100 according to the first embodiment. FIG. 4 is an illustrative front elevational view of the electronic device 100 according to the first embodiment.

As illustrated in FIGS. 1 to 4, the electronic device 100 represents, for example, a desktop personal computer including a housing 1, electronic components (not illustrated) housed in the housing 1, and a stand 10 attached to the housing 1. The housing 1 is placed upright on a mounting surface of, for example, a desk, a platform, a rack, or a shelf via the stand 10. The electronic device 100 is not limited to such an example and may be a laptop personal computer, a smartphone, a portable phone, a video display, a television receiver, or a game machine, for example.

Figure 5:
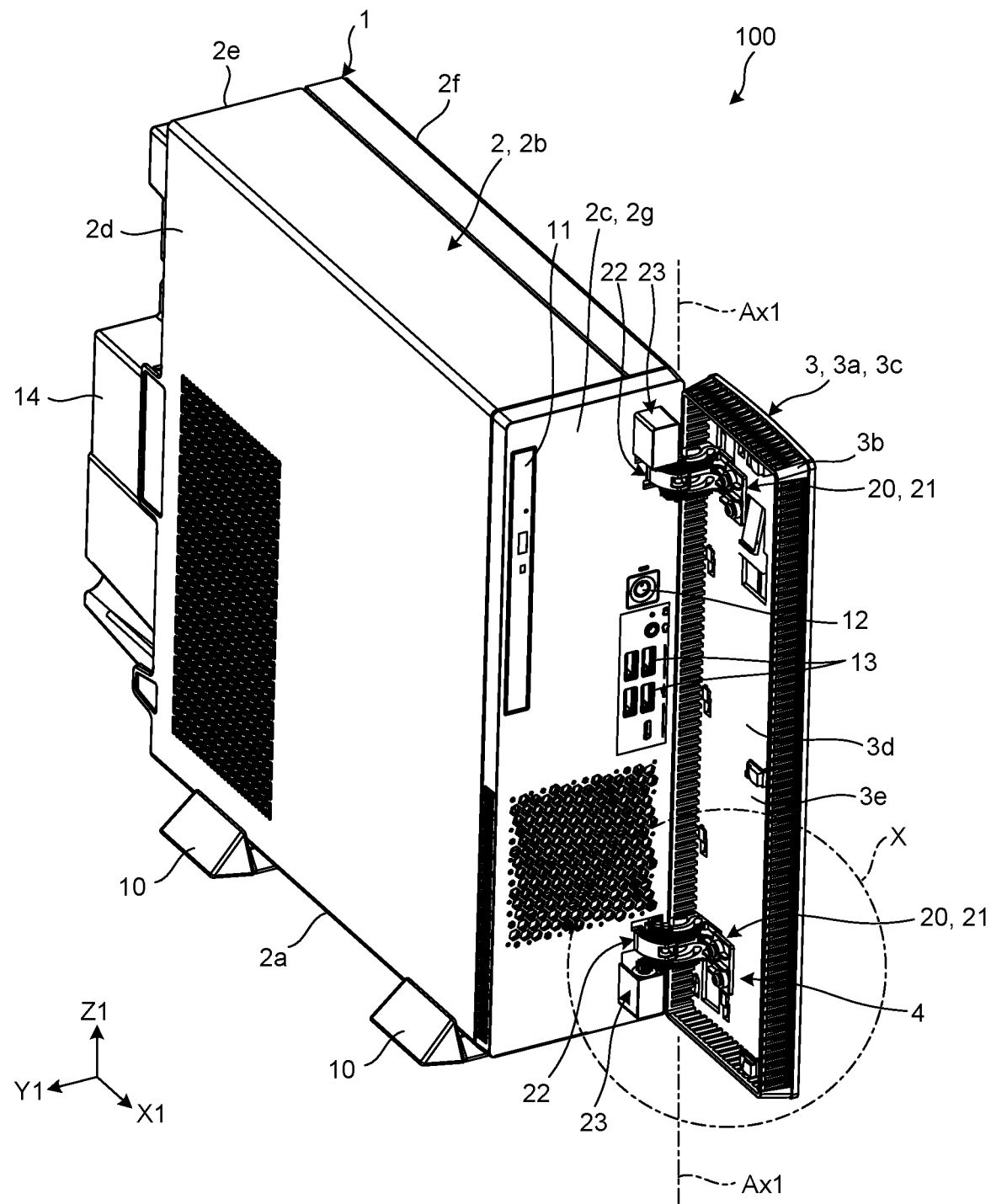
FIG. 5 is an illustrative perspective view of the electronic device according to the first embodiment, with a door placed in an open position.
Figure 6:
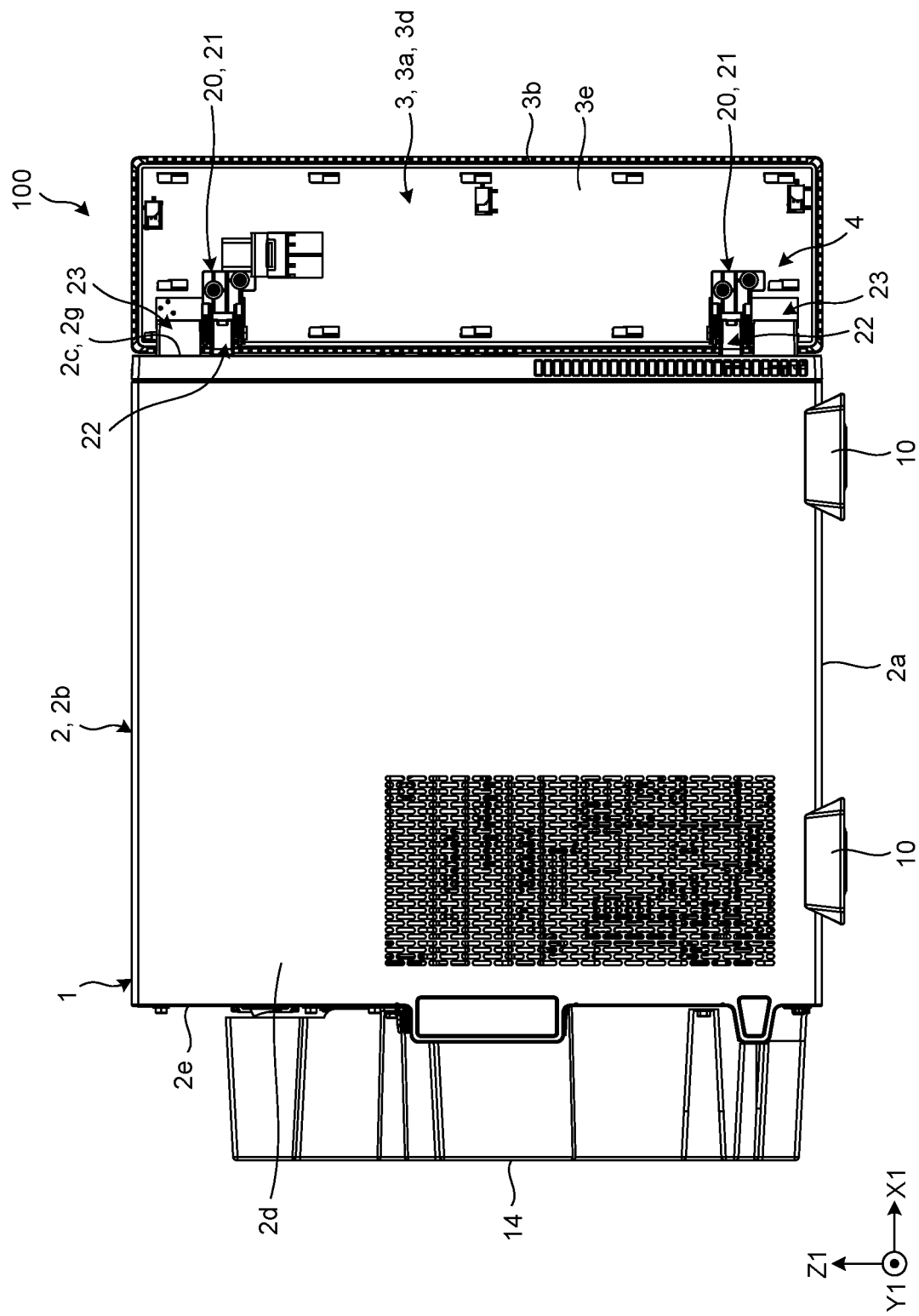
FIG. 6 is an illustrative side elevational view of the electronic device according to the first embodiment, with the door placed in the open position.
Figure 8:
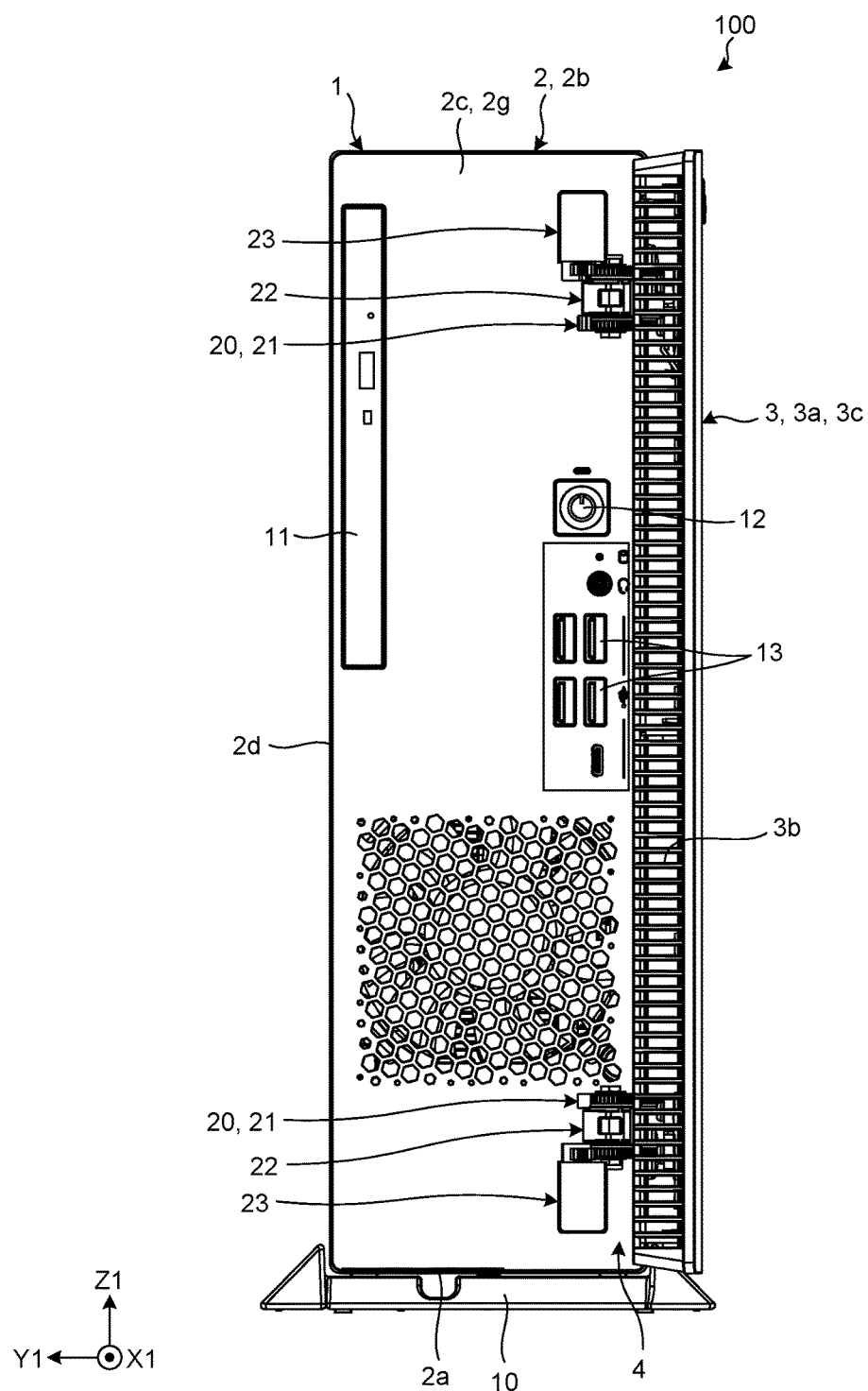
FIG. 8 is an illustrative front elevational view of the electronic device according to the first embodiment, with the door placed in the open position.
Figure 9:
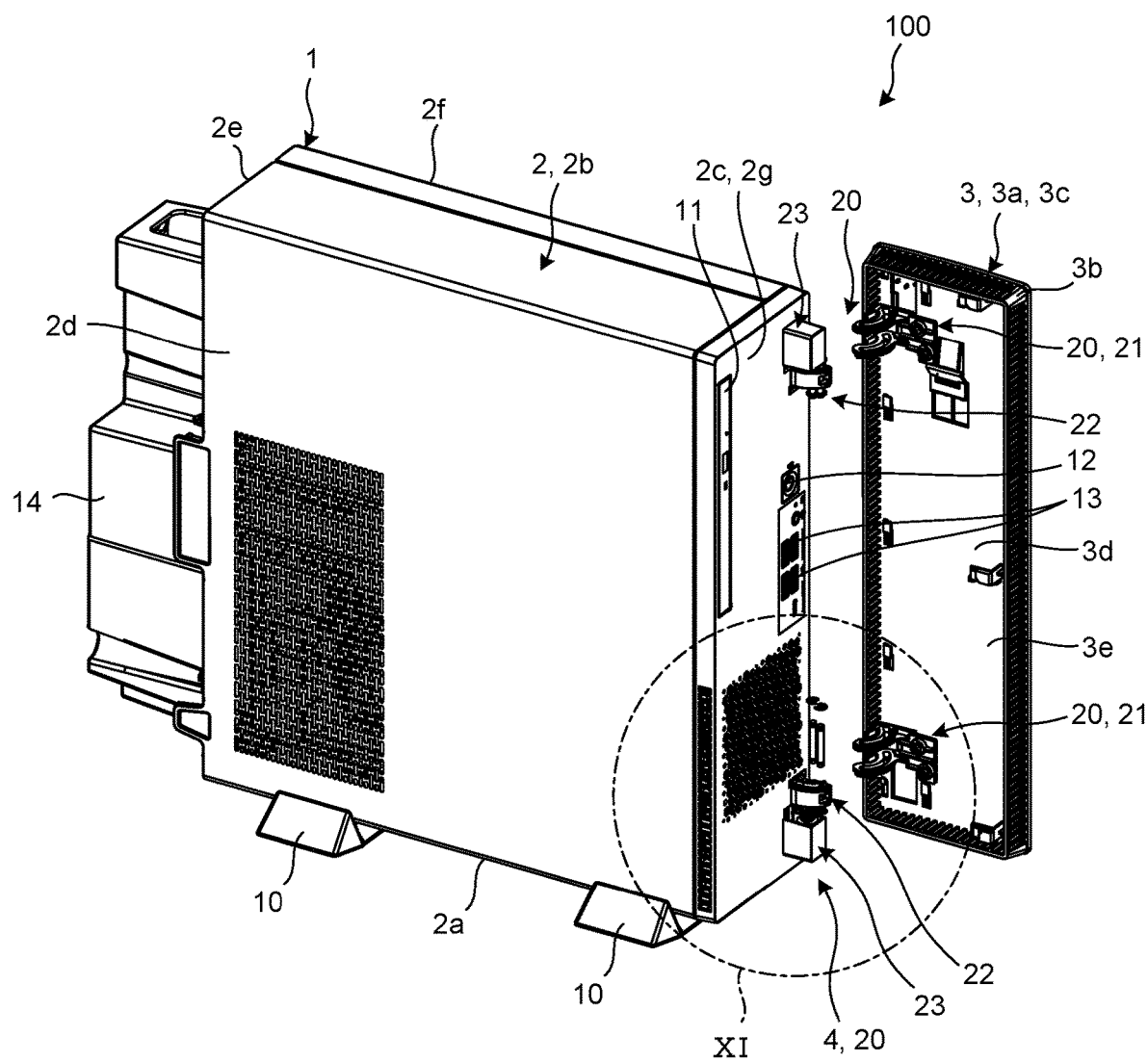
FIG. 9 is an illustrative exploded perspective view of the electronic device according to the first embodiment.

FIG. 5 is an illustrative perspective view of the electronic device 100 according to the first embodiment, with a door 3 placed in an open position. FIG. 6 is an illustrative side elevational view of the electronic device 100 according to the first embodiment, with the door 3 placed in the open position. FIG. 7 is an illustrative plan view of the electronic device 100 according to the first embodiment, with the door 3 placed in the open position. FIG. 8 is an illustrative front elevational view of the electronic device 100 according to the first embodiment, with the door 3 placed in the open position. FIG. 9 is an illustrative exploded perspective view of the electronic device 100 according to the first embodiment.

As illustrated in FIGS. 1 to 9, the housing 1 includes a base 2, the door 3, and a hinge 4. The hinge 4 openably couples the door 3 to the base 2. The base 2 is an exemplary second member. The door 3 is an exemplary first member and serves as an open and close member. The door 3 is also referred to as a cover. The open and close member may be, for example, a lid.

In the following, three mutually orthogonal directions are defined for the sake of convenience. An X1 direction is along the depth (in an anteroposterior direction or a longitudinal direction) of the base 2. A Y1 direction is along the width (horizontal or transverse length) of the base 2. A Z1 direction is along the height (vertical length) of the base 2.

The base 2 has, for example, a flat, rectangular parallelepiped box shape in the Y1 direction. The base 2 has a plurality of walls such as a bottom wall 2a, a top wall 2b, a front wall 2c, a left wall 2d, a rear wall 2e, and a right wall 2f. The bottom wall 2a is also referred to as a lower wall and the top wall 2b is also referred to as an upper wall. The front wall 2c, the left wall 2d, the rear wall 2e, and the right wall 2f are also referred to as sidewalls or peripheral walls.

The bottom wall 2a and the top wall 2b both extend in a direction orthogonal to the Z1 direction in an X1-Y1 plane, and are spaced apart in parallel from each other in the Z1 direction. The bottom wall 2a serves as the bottom end of the base 2. The top wall 2b serves as the top end of the base 2. The stand 10 is fixed to the bottom wall 2a.

The front wall 2c and the rear wall 2e both extend in a direction orthogonal to the X1 direction in a Y1-Z1 plane. The front wall 2c and the rear wall 2e are spaced apart in parallel from each other in the X1 direction. The front wall 2c extends between the ends of the bottom wall 2a and the top wall 2b in the X1 direction. The rear wall 2e extends between the ends of the bottom wall 2a and the top wall 2b in an opposite direction of the X1 direction. The front wall 2c serves as the front end of the base 2. The rear wall 2e serves as the rear end of the base 2. An optical drive 11, a power button 12, and connectors 13 are mounted on the front wall 2c. A cover 14 is removably attached to the rear wall 2e (FIG. 5). FIG. 1 and other drawings omit illustrating the cover 14.

The left wall 2d and the right wall 2f both extend in a direction orthogonal to the Y1 direction in an X1-Z1 plane. The left wall 2d and the right wall 2f are spaced apart in parallel from each other in the Y1 direction. The left wall 2d extends between the ends of the bottom wall 2a and the top wall 2b in the Y1 direction. The right wall 2f extends between the ends of the bottom wall 2a and the top wall 2b in an opposite direction of the Y1 direction. The left wall 2d serves as the left end of the base 2. The right wall 2f serves as the right end of the base 2.

As illustrated in FIGS. 1 to 9, the door 3 includes a wall 3a and a protrusion 3b. The door 3 is coupled to the right end of the front wall 2c of the base 2 with the hinge 4. More specifically, the door 3 is coupled to the front wall 2c of the base 2 with the hinge 4 so as to be rotatable about a rotational center Ax1 (FIG. 5) between a closed position (FIGS. 1 to 4) and an open position (FIGS. 5 to 8) in the Z1 direction. In the open position, the door 3 opens a front face 2g of the front wall 2c of the base 2 while in the close position, the door 3 covers the front face 2g of the base 2. The rotational center Ax1 is located outside the housing 1. In the closed position the door 3 is held by magnetic force of a magnet (not illustrated). The rotational center Ax1 is also referred to as an axis or a rotational axis.

In the closed position (FIGS. 1 to 4), the wall 3a extends in the direction orthogonal to the X1 direction in the Y1-Z1 plane and is located anterior to the front wall 2c of the base 2. The wall 3a has a front face 3c and a rear face 3d opposite the front face 3c. In the closed position (FIGS. 1 to 4) of the door 3, the rear face 3d opposes the front face 2g of the front wall 2c of the base 2. The rear face 3d is an exemplary opposing part of the door 3. The front face 2g of the front wall 2c of the base 2 is an exemplary opposing part of the base 2.

The protrusion 3b has a tubular shape along the periphery of the rear face 3d of the wall 3a and protrudes from the periphery of the rear face 3d oppositely to the front face 3c. In the closed position of the door 3 (FIGS. 1 to 4), the distal end of the protrusion 3b opposes the front face 2g of the front wall 2c of the base 2. The protrusion 3b is an exemplary opposing part of the door 3.

As illustrated in FIGS. 5 and 6, the door 3 is provided with a recess 3e. The recess 3e is surrounded by the protrusion 3b and the rear face 3d. The recess 3e opens to the distal end of the protrusion 3b and is recessed from the distal end of the protrusion 3b toward the rear face 3d. In the closed position of the door 3, the recess 3e opposes the front face 2g of the front wall 2c of the base 2. Specifically, the recess 3e opens to the base 2 with the door 3 covering the base 2.

As illustrated in FIGS. 5 and 9, the hinge 4 includes two hinge mechanisms 20. The two hinge mechanisms 20 are spaced apart from each other in the Z1 direction. The two hinge mechanisms 20 are symmetrical with respect to a plane passing between the two hinge mechanisms 20 and orthogonal to the Z1 direction.

Figure 10:
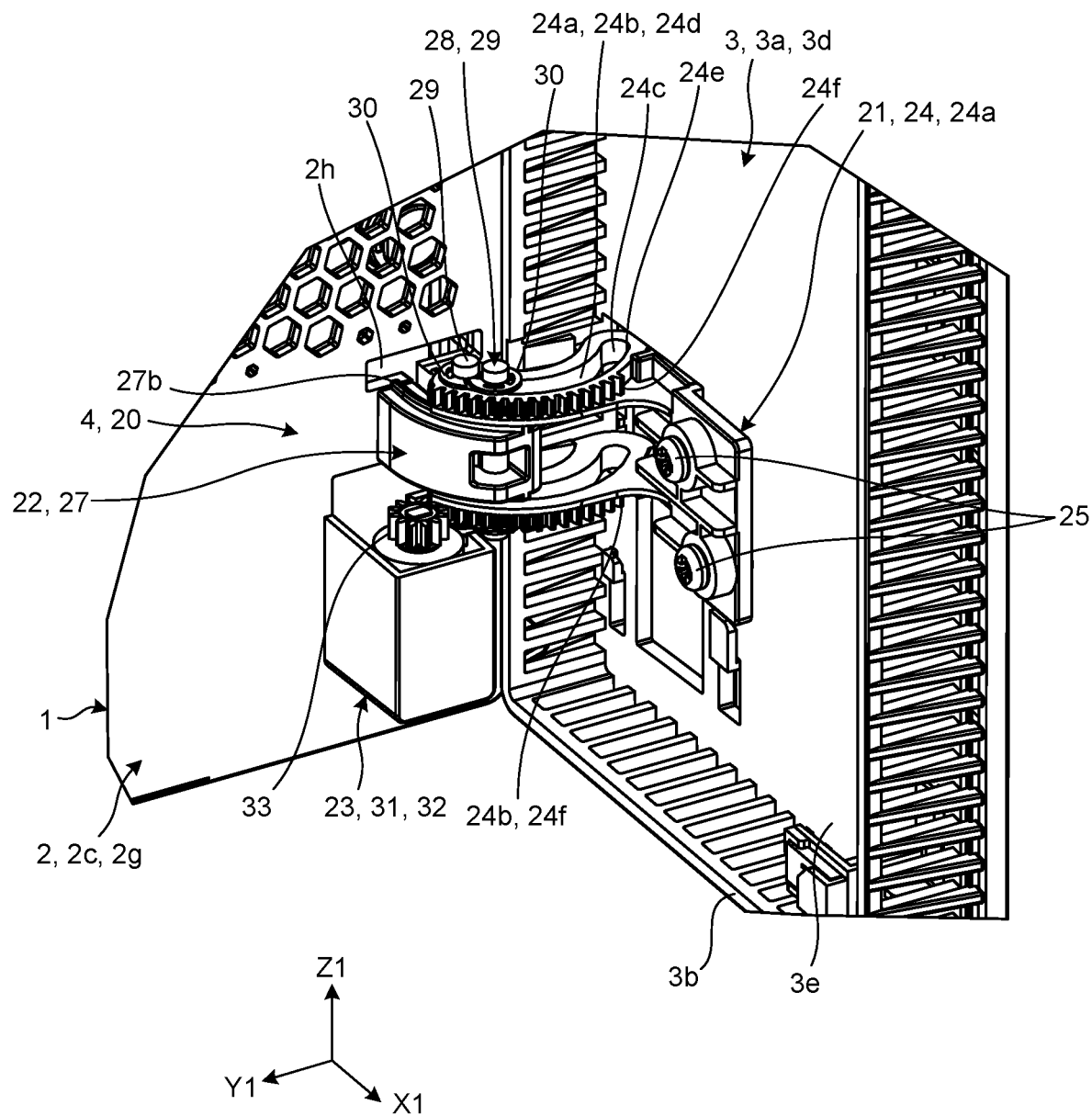
FIG. 10 is an enlarged view of part X in FIG. 5.
Figure 11:
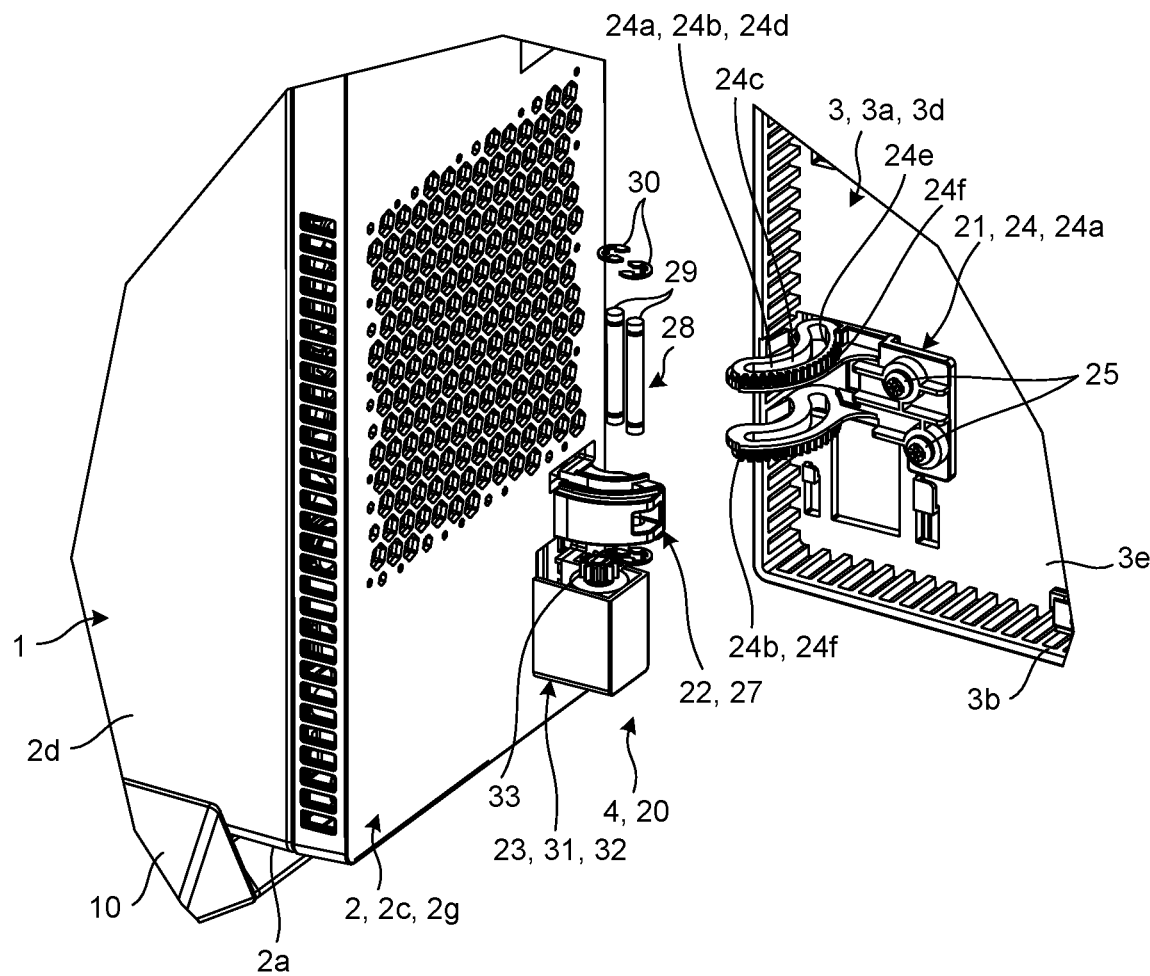
FIG. 11 is an enlarged view of part XI in FIG. 9.
Figure 12:
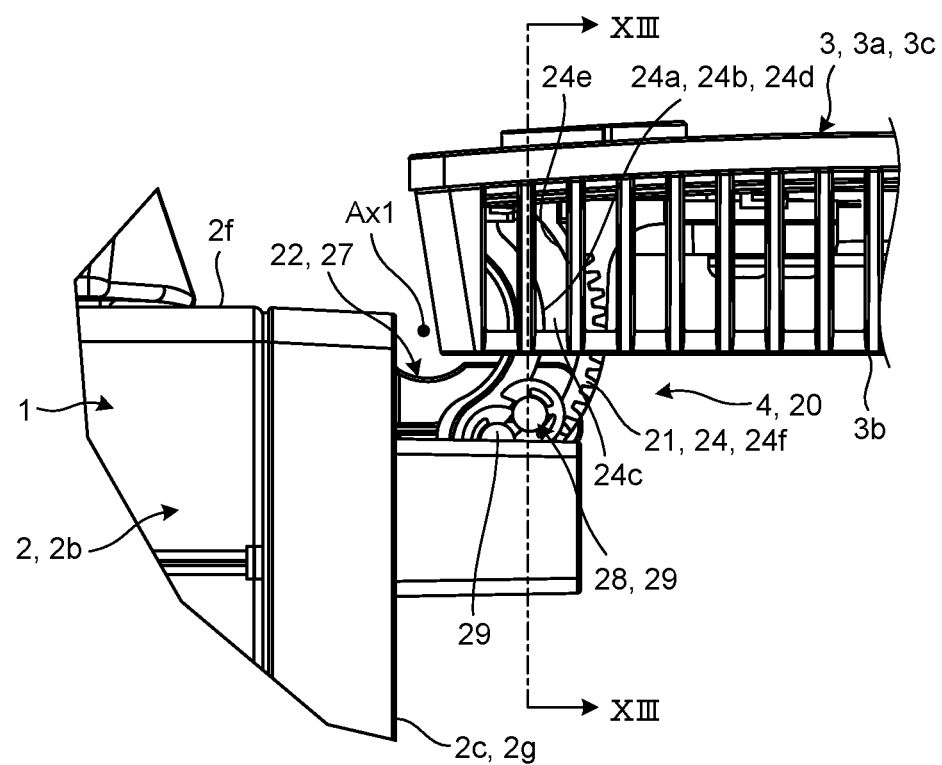
FIG. 12 is an enlarged view of part XII in FIG. 7.
Figure 13:
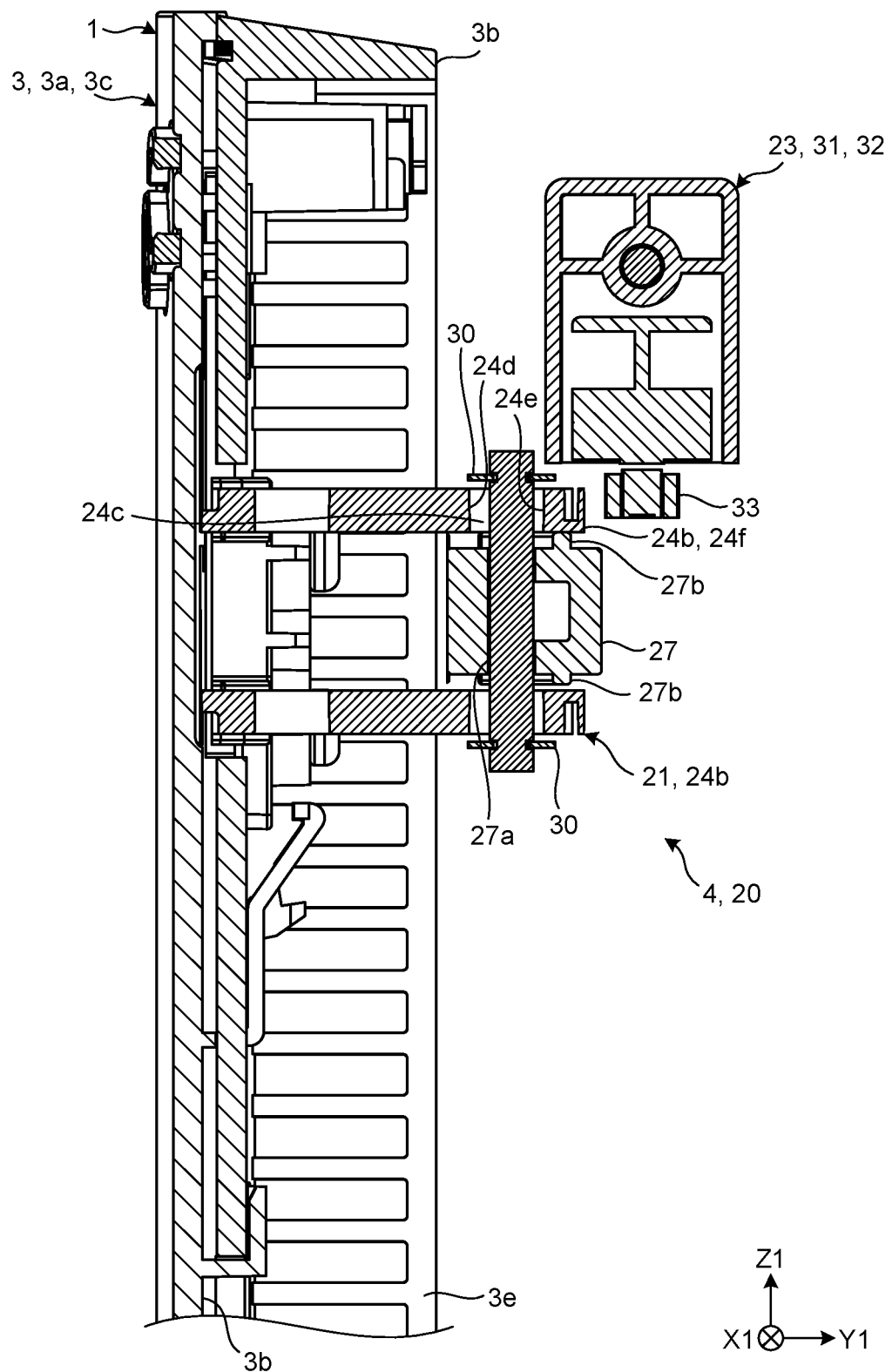
FIG. 13 is a cross-sectional view taken along XIII-XIII in FIG. 12.

FIG. 10 is an enlarged view of part X in FIG. 5. FIG. 11 is an enlarged view of part XI in FIG. 9. FIG. 12 is an enlarged view of part XII in FIG. 7. FIG. 13 is a cross-sectional view taken along XIII-XIII in FIG. 12.

As illustrated in FIGS. 10 to 13, the hinge mechanisms 20 each include a first part 21, a second part 22, and a gear mechanism 23. The first part 21 is located in the door 3. The second part 22 is located on the base 2. The gear mechanism 23 is located across the door 3 and the base 2.

As illustrated in FIGS. 11 and 12, the first part 21 includes a sliding member 24. The sliding member 24 includes a base 24a and two arms 24b. The sliding member 24 is formed of, for example, a metal material or a synthetic resin material.

The base 24a is fitted in the recess 3e in the door 3 and fixed to the rear face 3d of the wall 3a of the door 3 with fasteners 25 such as screws.

The two arms 24b are spaced apart from each other in the Z1 direction. The arms 24b protrude from the base 24a oppositely to the rear face 3d, that is, toward the base 2 of the housing 1. The arms 24b are curved, protruding to radially outside the rotational center Ax1 (FIG. 12). In other words, the arms 24b are curved, protruding in a direction orthogonal to the axial direction of the rotational center Ax1 and away from the rotational center Ax1.

Each of the arms 24b is provided with a through hole 24c. The through hole 24c passes through the arm 24b in the axial direction of the rotational center Ax1 (Z1 direction). The through hole 24c has a curved shape protruding to radially outside the rotational center Ax1. In other words, the arm 24b is curved, protruding in the direction orthogonal to the axial direction of the rotational center Ax1 and away from the rotational center Ax1. As viewed in the axial direction of the rotational center Ax1, the through hole 24c is a long hole, long in the circumferential direction of the rotational center Ax1 and short in the radial direction of the rotational center Ax1. The through hole 24c is also referred to as an opening.

The arms 24b each include a first curved part 24d and a second curved part 24e, both facing the through hole 24c.

The first curved part 24d is located radially inside the rotational center Ax1 with respect to the through hole 24c. As viewed in the axial direction of the rotational center Ax1, the first curved part 24d has an arc form (circular arc), protruding to radially outside the rotational center Ax1. Specifically, the first curved part 24d is a curved surface.

The second curved part 24e is located radially outside the rotational center Ax1 with respect to the through hole 24c. The second curved part 24e is located radially outside the rotational center Ax1 with spacing from the first curved part 24d. As viewed in the axial direction of the rotational center Ax1, the second curved part 24e has an arc form (circular arc), extending along the first curved part 24d. Specifically, the second curved part 24e is a curved surface.

The first curved part 24d and the second curved part 24e are coupled to each other, forming a peripheral surface surrounding the through hole 24c.

The arm 24b further includes a first gear 24f in the part radially outside the rotational center Ax1. The first gear 24f is an arc-shaped rack curved along the first curved part 24d.

As illustrated in FIGS. 10 to 13, the second part 22 includes a stationary member 27 and a connection 28.

The stationary member 27 is fixed to the front face 2g of the front wall 2c of the base 2 of the housing 1 and protrudes forward (in the X1 direction) from the front face 2g. The stationary member 27 is formed of, for example, a metal material or a synthetic resin material. The stationary member 27 includes holders 27b of a convex form on the top surface and the bottom surface. The holders 27b are curved, protruding to radially outside the rotational center Ax1 (FIG. 12). In other words, each holder 27b has a curved shape, protruding in a direction orthogonal to the axial direction of the rotational center Ax1 and away from the rotational center Ax1. The holders 27b receive the arms 24b of the sliding member 24.

The connection 28 is located between the first curved part 24d and the second curved part 24e in the sliding member 24 and is slidable relative to the first curved part 24d and the second curved part 24e about the rotational center Ax1. More specifically, the connection 28 includes two shafts 29. The two shafts 29 are supported by the stationary member 27 while the shafts 29 are juxtaposed around the rotational center Ax1 with their axes aligned in the axial direction of the rotational center Ax1. As illustrated in FIG. 13, the shafts 29 are inserted in a through hole 27a passing the stationary member 27 in the axial direction of the rotational center Ax1 and are prevented from detaching from the stationary member 27 or the through hole 27a with retainers 30. FIG. 13 illustrates only one through hole 27a, however, each of the shafts 29 is provided with the through hole 27a. Thus, the stationary member 27 is provided with two through holes 27a. The retainers 30 are, for example, E-rings and are fitted in annular grooves in the shafts 29.

The first part 21 and the second part 22 as configured as above serve to couple the door 3 and the base 2 together to be rotatable about the rotational center Ax1 relative to each other. More specifically, the first part 21 and the second part 22 couple the door 3 and the base 2 such that the door 3 (first member) and the base 2 can be rotationally movable relative to each other between the closed position (FIGS. 1 to 4) and the open position (FIGS. 5 to 8). In the closed state, the rear face 3d and the protrusion 3b of the door 3 oppose the front face 2g of the base 2. In the open state, the rear face 3d and the protrusion 3b of the door 3 are away from the front face 2g of the base 2. In the first embodiment the base 2 is placed on the mounting surface, so that the door 3 rotates relative to the base 2.

As illustrated in FIG. 10, the gear mechanism 23 includes the first gears 24f and a damper 31. The damper 31 is, for example, an oil damper. The damper 31 includes a support 32 and a second gear 33. The support 32 is filled with oil. The second gear 33 is a pinion. The second gear 33 is rotatably supported by the support 32 and meshes with the first gear 24f. The rotational center of the second gear 33 is parallel to the rotational center Ax1. The second gear 33 rotates, receiving resistance from the oil in the damper 31. Specifically, the damper 31 applies resisting force to the second gear 33 and the door 3 in rotation. In detail, the damper 31 applies a resisting force to the door 3 rotating from the open position to the closed position and rotating from the closed position to the open position. The first gear 24f and the second gear 33 of the gear mechanism 23 work to restrict relative movement of the first part 21 and the second part 22 in the radial direction of the rotational center Ax1. The gear mechanism 23 is also referred to as a resisting mechanism or a restricting mechanism.

Figure 14:
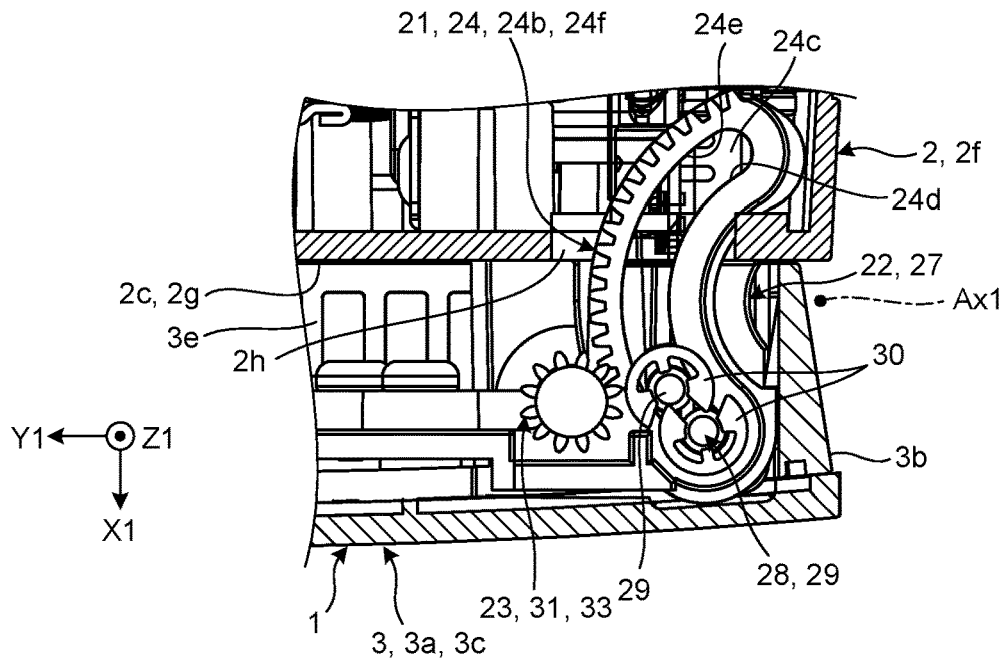
FIG. 14 is an illustrative cross-sectional view of a part of the electronic device according to the first embodiment, with the door placed in a closed position.
Figure 15:
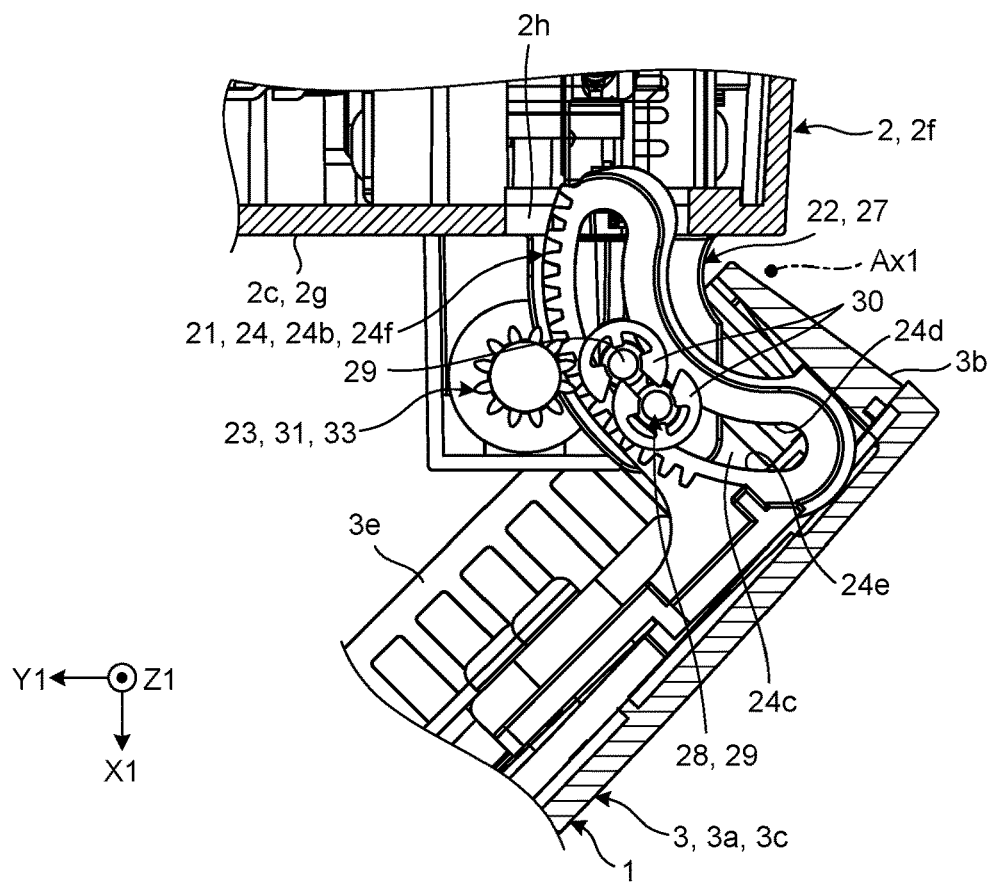
FIG. 15 is an illustrative cross-sectional view of a part of the electronic device according to the first embodiment, with the door placed in an intermediate position.
Figure 16:
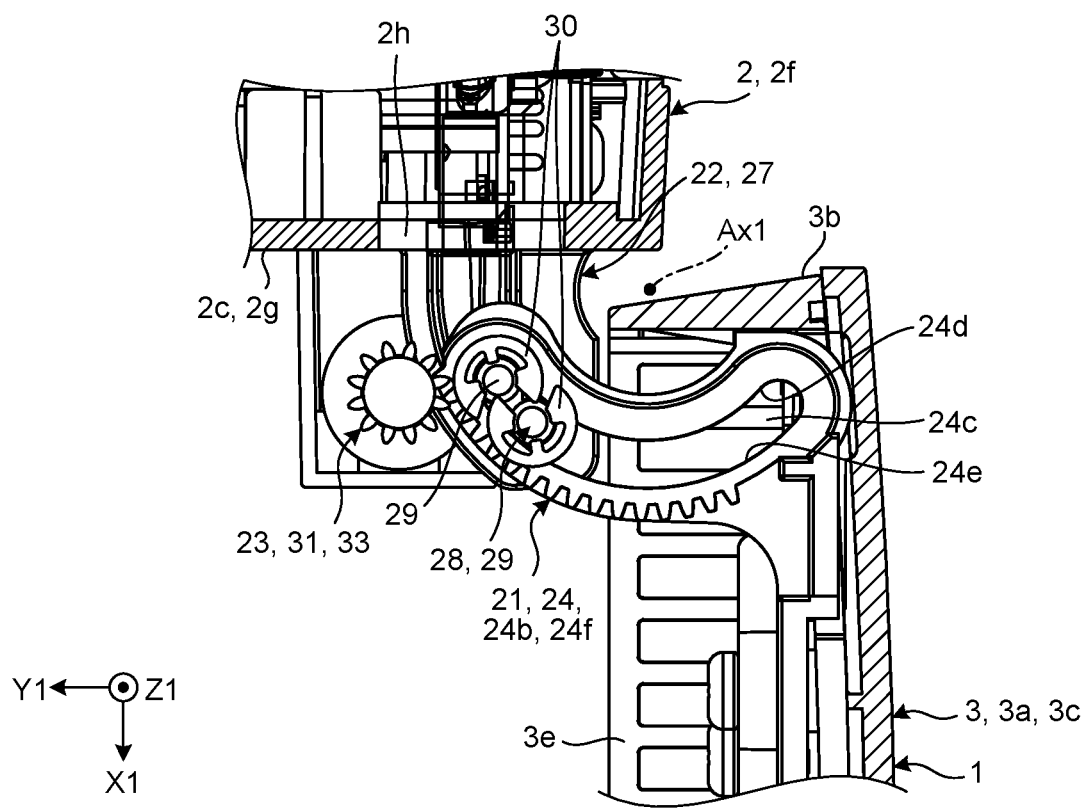
FIG. 16 is an illustrative cross-sectional view of a part of the electronic device according to the first embodiment, with the door placed in the open position.

FIG. 14 is an illustrative cross-sectional view of a part of the electronic device 100 according to the first embodiment, with the door 3 placed in the closed position. FIG. 15 is an illustrative cross-sectional view of a part of the electronic device 100 according to the first embodiment, with the door 3 placed in an intermediate position. FIG. 16 is an illustrative cross-sectional view of a part of the electronic device 100 according to the first embodiment, with the door 3 placed in the open position.

As illustrated in FIGS. 14 to 16, along with the rotation of the door 3 from the closed position (FIG. 14) to the open position (FIG. 16) by way of the intermediate position (FIG. 15) therebeween, the sliding member 24 slides relative to the connection 28. The connection 28 guides the sliding member 24 such that the door 3 moves along the first curved part 24d and the second curved part 24e of the sliding member 24, that is, the door 3 rotates about the rotational center Ax1. Thereby, the door 3 rotates along the arc shape of the first curved part 24d. In addition, the first gear 24f and the second gear 33 of the gear mechanism 23 restrict relative movement of the first part 21 and the second part 22 in the radial direction of the rotational center Ax1. The damper 31 of the gear mechanism 23 applies the resisting force to the door 3 in rotation.

In the closed position of the door 3 as illustrated in FIG. 14, of the arm 24b of the first part 21, part of the first curved part 24d including the distal end and part of the second curved part 24e including the distal end are inserted in the base 2 through a through hole 2h in the front face 2c of the base 2. In the open position of the door 3 as illustrated in FIG. 16, the first curved part 24d and the second curved part 24e of the arm 24b of the first part 21 are entirely located outside the base 2.

As described above, in the first embodiment, the hinge 4 includes the first part 21 located in the door 3 (first member), and the second part 22 located on the base 2 (second member). The first part 21 includes the first curved part 24d of an arc shape protruding to radially outside the rotational center Ax1; and the second curved part 24e of an arc shape along the first curved part 24d, and located outside the first curved part 24d in the radial direction of the rotational center Ax1 with spacing from the first curved part 24d. The second part 22 includes the connection 28 located between the first curved part 24d and the second curved part 24e to be slidable relative to the first curved part 24d and the second curved part 24e about the rotational center Ax1. The second part 22 and the first part 21 couples the door 3 and the base 2 together so as to allow the door 3 and the base 2 to rotate relative to each other about the rotational center Ax1. Thus, the hinge 4 of the first embodiment does not include a shaft in the rotational center Ax1 for coupling the door 3 and the base 2, which can relieve restrictions on the external forms of the door 3 and the base 2 around the rotational center Ax1.

For the sake of comparison, to additionally include a shaft for connecting the door 3 and the base 2 in the rotational center Ax1, for example, the base 2 is to include a protrusion to be coupled to the shaft, and the door 3 is to be provided with a recess in which the protrusion is fitted. Thus, the protrusion and the recess are to be added, imposing more restrictions on the external forms. In contrast, the hinge 4 of the first embodiment can exclude the protrusion and the recess, thereby relieving the restrictions on the external forms of the door 3 and the base 2.

In the first embodiment, for example, the connection 28 includes the shafts 29 in juxtaposition around the rotational center Ax1 with their axes aligned in the axial direction of the rotational center Ax1. This can restrict the connection 28 and the first part 21 from relatively rotating about the connection 28, for example. Further, by adjusting the interval between the shafts 29, the amount of insertion of the arms 24b into the housing 1 can be adjusted. Thus, the arms 24b can be prevented from affecting the arrangement of internal structures in the housing 1. In the first embodiment, the arms 24b enter only a front bezel including the front wall 2c, of the housing 1. The front bezel is, for example, an ornamental member.

In the first embodiment, for example, the gear mechanism 23 includes the first gear 24f located in the door 3, and the second gear 33 located on the base 2 to mesh with the first gear 24f. The gear mechanism 23 serves to restrict relative movement of the first part 21 and the second part 22 in the radial direction of the rotational center Ax1. Thus, according to the first embodiment, the door 3 and the base 2 can be rotated about the rotational center Ax1 with substantially no backlash.

In the first embodiment, for example, the door 3 is provided with the recess 3e opening toward the base 2 while the door 3 covers the base 2. The first part 21 of the hinge 4 is placed in the recess 3e. Thus, in the first embodiment, part of the first part 21 located inside the recess 3e can be protected, for example.

In the first embodiment, for example, the damper 31 applies resisting force to the door 3 in rotation from the open position to the closed position and from the closed position to the open position. Thus, according to the first embodiment, for example, the door 3 can be prevented from rotating at an increased speed, leading to providing improved safety.

Second Embodiment

Figure 17:
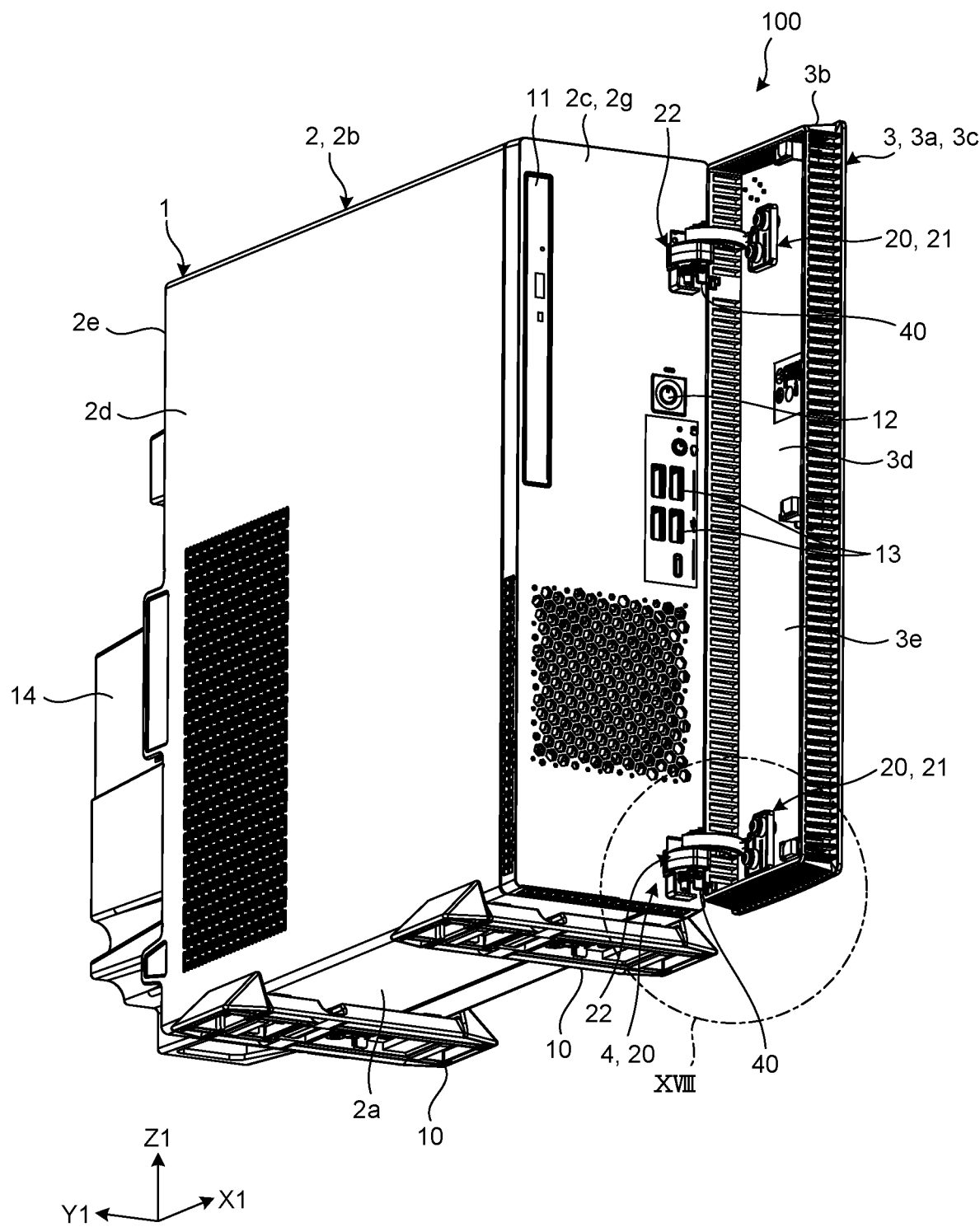
FIG. 17 is an illustrative perspective view of an electronic device according to a second embodiment, with a door placed in an open position.
Figure 18:
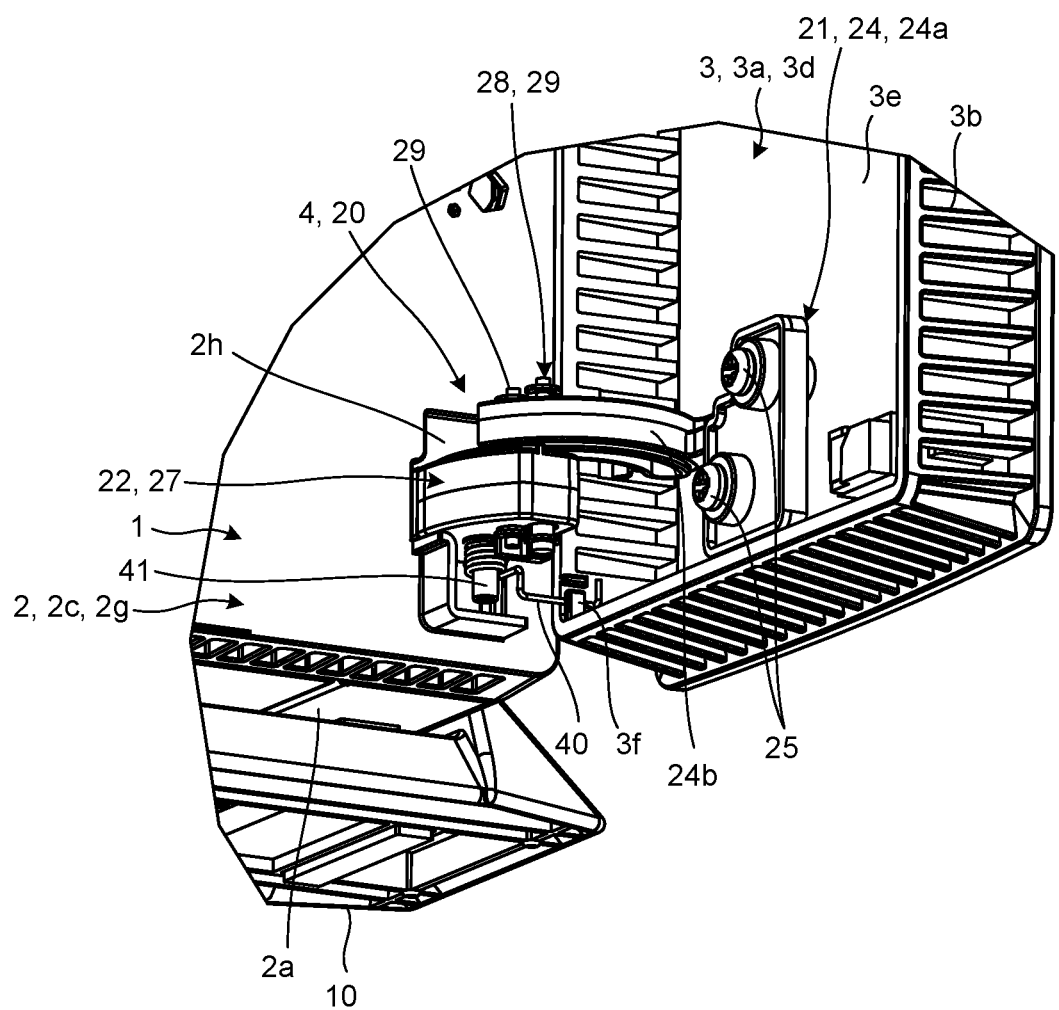
FIG. 18 is an enlarged view of part XVIII in FIG. 17.

The following describes a second embodiment. FIG. 17 is an illustrative perspective view of an electronic device 100 according to the second embodiment, with a door 3 placed in the open position. FIG. 18 is an enlarged view of part XVIII in FIG. 17.

The electronic device 100 in the second embodiment includes elements identical to the elements of the electronic device 100 in the first embodiment. Thus, the second embodiment can achieve results and effects identical to those based on the configuration of the first embodiment.

The second embodiment, however, differs from the first embodiment in that a hinge 4 includes an elastic member 40, for example, as illustrated in FIGS. 17 and 18. The hinge mechanisms 20 each include the elastic member 40 placed between the door 3 and a base 2.

As illustrated in FIG. 18, the elastic member 40 is, for example, a torsion coil spring. The hinge mechanism 20 is provided with a shaft 41 on a second part 22, and the shaft 41 is inserted in the coil of the elastic member 40. The end of the elastic member 40 on the base 2 side is fixed to a stationary member 27 and the base 2. The opposite end of the elastic member 40 on the door 3 side is fixed to a fixing part 3f of the door 3. The elastic member 40 presses the door 3 toward the open position. The elastic member 40 thus generates elastic force that serves as resistance to the door 3 when closed. Specifically, the elastic member 40 generates the elastic force serving as the resistance to the door 3 and the base 2 when moving from the open position to the closed position.

As described above, in the second embodiment, for example, the hinge mechanism 20 includes the elastic member 40 placed between the door 3 and the base 2. The elastic member 40 generates the elastic force serving as the resistance to the door 3 and the base 2 moving from the open position to the closed position. Thus, the door 3 can be prevented from rotating from the open position to the closed position at an increased speed. This can avoid the door 3 from hitting the base 2 hard, enhancing safety.

While the second embodiment has described the torsion coil spring as an example of the elastic member 40, the elastic member 40 is not limited to the torsion coil spring. The elastic member 40 may be, for example, a blade spring.

Third Embodiment

Figure 19:
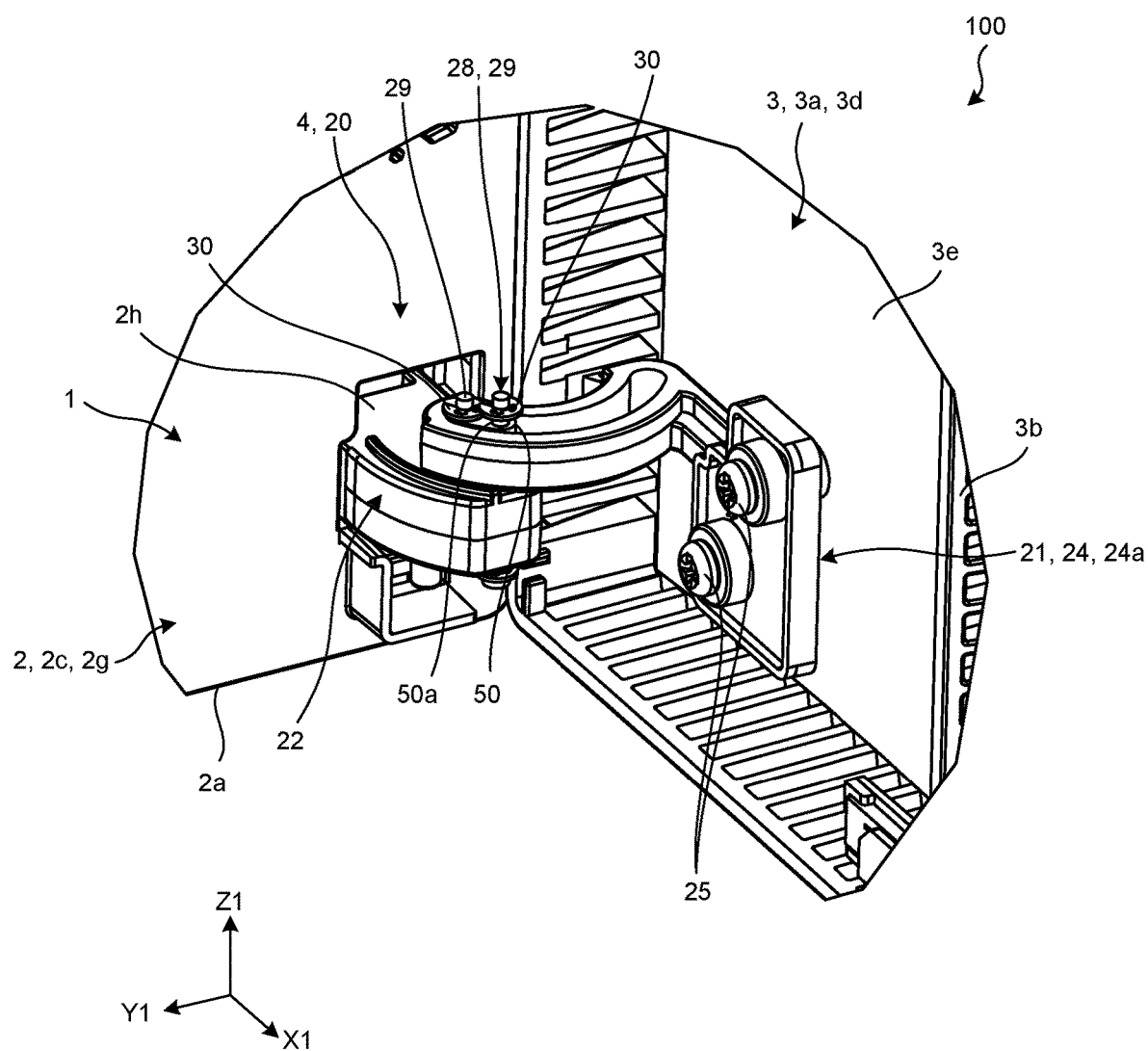
FIG. 19 is an illustrative perspective view of a part of an electronic device according to a third embodiment, with a door placed in an open position.

The following describes a third embodiment. FIG. 19 is an illustrative perspective view of a part of an electronic device 100 according to the third embodiment, with a door 3 placed in the open position.

The electronic device 100 in the third embodiment includes elements identical to the elements of the electronic device 100 in the first embodiment. Thus, the third embodiment can achieve results and effects identical to those based on the configuration of the first embodiment.

The third embodiment, however, differs from the first embodiment in that a connection 28 of a second part 22 of a hinge 4 includes an elastomer 50 as illustrated in FIG. 19, for example.

The elastomer 50 extends between shafts 29 and, a first curved part 24d and a second curved part 24e of a first part 21. More specifically, the elastomer 50 is provided with two through holes 50a into which the two shafts 29 are inserted. FIG. 19 illustrates only one of the two through holes 50a. The through holes 50a pass the elastomer 50 in the axial direction of the rotational center Ax1. The elastomer 50 includes two curved parts on the outer periphery. One of the curved parts extends, following and contacting the first curved part 24d. The other of the curved parts extends, following and contacting the second curved part 24e. The elastomer 50 is compressively deformed between the first curved part 24d and the second curved part 24e, for example. The elastomer 50 may not be compressively deformed.

The elastomer 50 generates the resisting force to the door 3 in rotation. More specifically, the elastomer 50 generates the resisting force to the door 3 in rotation both from the open position to the closed position and from the closed position to the open position. The resisting force is friction force occurring between the outer periphery of the elastomer 50, and the first curved part 24d and the second curved part 24e. The elastomer 50 further works to restrict relative movement of the first part 21 and the second part 22 in the radial direction of the rotational center Ax1.

As described above, in the third embodiment, for example, the connection 28 includes the shafts 29 having the axes aligned in the axial direction of the rotational center Ax1, and the elastomer 50 placed between the shafts 29, and the first curved part 24d and the second curved part 24e. Thus, according to the third embodiment, for example, the elastomer 50 generates the resisting force to the door 3 in rotation from the open position to the closed position and from the closed position to the open position, which can prevent the door 3 from rotating at a higher speed and improve safety. Additionally, the elastomer 50 serves to restrict the relative movement of the first part 21 and the second part 22 in the radial direction of the rotational center Ax1, so that the door 3 and the base 2 can rotate about the rotational center Ax1 with substantially no backlash.

The first to third embodiments have described the example that the first part 21 of the hinge 4 is located in the door 3 and the second part 22 of the hinge 4 is located on the base 2. However, the embodiments are not limited to such an example. For example, the first part 21 of the hinge 4 may be located on the base 2 and the second part 22 of the hinge 4 may be located in the door 3. In this case, the base 2 is an exemplary first member and the door 3 is an exemplary second member.

The first to third embodiments have described the example that the first curved part 24d and the second curved part 24e have a circular arc shape. However, the embodiments are not limited to such an example. The first curved part 24d and the second curved part 24e may have an elliptical arc shape, for example.

The first to third embodiments have described the example of two shafts 29, however, the number of the shafts 29 is not limited thereto. For example, the number of the shafts 29 may be one or three or more.

The first to third embodiments have described the example that the connection 28 includes the shafts 29, however, the embodiments are not limited to such an example. The connection 28 may not include the shafts 29 but include a curved member along the first curved part 24d and the second curved part 24e, for example.

According to one aspect of this disclosure, it is possible to provide a hinge that can reduce restrictions on the external forms of the first member and the second member to be coupled together around the rotational center, and a housing for an electronic device including the hinge.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A hinge comprising:
   a first part disposed in a first member, the first part comprising:
      a first curved part having an arc shape protruding to outside in a radial direction of a rotational center; and
      a second curved part disposed outside the first curved part in the radial direction of the rotational center with spacing from the first curved part having an arc shape along the first curved part; and
   a second part disposed on a second member, the second part comprising:
      a connection disposed between the first curved part and the second curved part, wherein
   the connection is slidable along the first curved part and the second curved part about the rotational center, and
   the second part couples, with the first part, the first member and the second member together such that the first member and the second member rotate relatively about the rotational center.

2. The hinge according to claim 1, wherein
   the connection comprises a plurality of shafts in juxtaposition around the rotational center, and
   the shafts have axes aligned in an axial direction of the rotational center.

3. The hinge according to claim 1, further comprising:
   an elastic member disposed between the first member and the second member, wherein
   the first part and the second part couple the first member and the second member together such that the first member and the second member are rotationally movable with respect to each other between a closed position and an open position,
   the closed position is a position in which an opposing part of the first member and an opposing part of the second member oppose each other,
   the open position is a position in which the opposing part of the first member and the opposing part of the second member are away from each other, and
   the elastic member generates elastic force serving as resistance to the first member and the second member when moving from the closed position to the open position.

4. The hinge according to claim 1, further comprising:
   a gear mechanism comprising:
      a first gear disposed in the first member, and
      a second gear disposed in the second member and that meshes with the first gear, wherein
   the gear mechanism restricts relative movement of the first part and the second part in the radial direction of the rotational center.

5. The hinge according to claim 1, wherein
   the connection comprises:
      a shaft having an axis aligned in an axial direction of the rotational center; and
      an elastomer extending between the shaft, and the first curved part and the second curved part.

6. The hinge according to claim 1, wherein
   the first member serves as an open and close member that is opened and closed with respect to the second member.

7. A housing for an electronic device, the housing comprising:
   the hinge according to claim 1;

the first member; and
the second member.

8. The housing for an electronic device according to claim 7, wherein
 the first member serves as an open and close member that is opened and closed with respect to the second member,
 the first member is provided with a recess that opens toward the second member while the first member covers the second member, and
 the first part is disposed in the recess.

* * * * *